(12) United States Patent
Damgaard et al.

(10) Patent No.: US 6,670,849 B1
(45) Date of Patent: Dec. 30, 2003

(54) SYSTEM FOR CLOSED LOOP POWER CONTROL USING A LINEAR OR A NON-LINEAR POWER AMPLIFIER

(75) Inventors: Morten Damgaard, Laguna Hills, CA (US); Dmitriy Rozenblit, Irvine, CA (US); William J. Domino, Yorba Linda, CA (US); Ricke W. Clark, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 409 days.

(21) Appl. No.: 09/650,987

(22) Filed: Aug. 30, 2000

(51) Int. Cl.[7] .............................. H03G 3/20; H03F 1/36; H04B 1/04
(52) U.S. Cl. ........................ 330/129; 330/85; 330/140; 455/126
(58) Field of Search ................... 330/85, 129, 140; 455/126, 127, 522

(56) References Cited

U.S. PATENT DOCUMENTS

| | | | |
|---|---|---|---|
| 5,003,270 A | | 3/1991 | Braathen et al. ............ 330/279 |
| 5,319,804 A | * | 6/1994 | Matsumoto et al. ......... 455/126 |
| 5,710,521 A | | 1/1998 | Butler ......................... 330/52 |
| 5,742,201 A | | 4/1998 | Eisenberg et al. ............. 330/2 |
| 6,008,697 A | | 12/1999 | Sparks ......................... 330/279 |
| 6,038,428 A | * | 3/2000 | Mizusawa et al. ............ 455/69 |
| 6,047,168 A | | 4/2000 | Carlsson et al. ............. 455/126 |
| 6,408,193 B1 | * | 6/2002 | Katagishi et al. ........... 455/571 |

* cited by examiner

Primary Examiner—Patricia Nguyen
(74) Attorney, Agent, or Firm—Needle & Rosenberg, P.C.

(57) ABSTRACT

A system for a closed power control feedback loop allows for the use of a non-linear amplifier for amplifying a phase modulated (PM) signal while introducing an inverse version of the desired amplitude modulated (AM) signal into the feedback loop using a variable gain element. By introducing an inverse version of the desired AM portion of the signal into the power control feedback loop, the non-linear, and highly efficient, power amplifier may be used to amplify only the PM portion of the signal, while the AM portion is introduced by the power control feedback loop. In another aspect of the invention, an inverse version of the AM portion of the desired transmit signal is introduced into the power control feedback loop of an amplifier that is amplifying both a phase modulated signal and an amplitude modulated signal. By introducing an inverse version of the desired AM signal into the power control feedback loop, the power control feedback loop may not cancel the AM component present at the output of the power amplifier. In yet another aspect of the invention, the desired AM signal is injected into the feedback loop along with the power control reference signal.

44 Claims, 4 Drawing Sheets

SYSTEM FOR CLOSED LOOP POWER CONTROL USING A LINEAR OR A NON-LINEAR POWER AMPLIFIER

BACKGROUND OF THE INVENTION

1. Field of the Invention

This invention relates generally to power control in a wireless communication device transmitter, and, more particularly, to a system for closed power control feedback loop using a linear or a non-linear amplifier.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld telephone like communication handset. The different modulation and transmission schemes each have advantages and disadvantages.

In a typical global system for mobile communications (GSM) mobile communication system, a gaussian minimum shift keying ("GMSK") modulation scheme supplies a very clean phase modulated ("PM") transmit signal to a non-linear power amplifier directly from an oscillator. In such an arrangement, a non-linear power amplifier, which is highly efficient, can be used thereby allowing efficient modulation of the phase modulated signal and minimizing power consumption. Because the modulated signal is supplied directly from an oscillator, the need for filtering, either before or after the power amplifier, is minimized. Other transmission standards, however, are being developed in which both a PM signal and an amplitude modulated ("AM") signal are transmitted. Standards such as these increase the data rate without increasing the bandwidth of the transmitted signal. Unfortunately, existing GSM modulation schemes are not easily adapted to transmit a signal that includes both a PM component and an AM component. One reason for this difficulty is that in order to transmit a signal containing a PM component and an AM component, a highly linear power amplifier is required. Unfortunately, highly linear power amplifiers are very inefficient, thus consuming significantly more power than a non-linear power amplifier and drastically reducing the life of the battery or other power source.

This condition is further complicated because transmitters typically employed in GSM communication systems transmit in bursts and must be able to control the ramp-up of the transmit power as well as have a high degree of control over the output power level over a wide power range. This power control is typically performed using a feedback loop in which a portion of the signal output from the power amplifier is compared with a reference signal and the resulting error signal is fed back to the control input of the power amplifier.

When attempting to include a PM component and an AM component in a GSM type modulation system, the power control loop will tend to fight against the amplitude variations present in the signal while attempting to maintain the desired output power. In such an arrangement, the power control loop tends to cancel the AM portion of the signal.

In such transmission signals containing both PM and AM components, the output power can be controlled by applying a predetermined control voltage to the power amplifier. Unfortunately, this requires the use of a highly linear, and therefore very inefficient, power amplifier. In non-burst transmission systems the output power may be controlled by a feedback loop having a time-constant that is very low compared to the time-constant of the amplitude variations of the modulator. Another known method to control the output power is to "predistort" the modulated signal in such a way that the power control loop will cancel the effect of the predistortion. In such a method, the amplitude information is passed through a transfer function that is the inverse of the power control loop transfer function. Unfortunately, these methods are costly and inefficient.

In those transmission standards where both a PM signal and an AM signal are sent to a power amplifier, unless the power amplifier is very linear, it may distort the combined transmission signal by causing undesirable AM to PM conversion. This conversion is detrimental to the transmit signal and can require the use of a costly and inefficient linear power amplifier.

Further still, in some communication systems, the output power is controlled by a signal from the base station with which the portable transceiver is communicating. Typically, in such an arrangement, the base station simply sends a signal to the portable transceiver instructing the portable transceiver to increase or decrease power. In such a system, there is no specific power requirement, just the command to either increase or decrease power output. Therefore, within such a portable transceiver, there is no need for closed loop power control; an open loop power control is sufficient. In open loop power control, a control signal within the mobile unit requests a particular power level without any feedback as to whether the value is achieved. The control characteristic need only be monotonic, but not particularly accurate, because the base station effectively provides feedback by continually updating its increase/decrease requests. In other transmission systems, such as GSM (which employs only PM) or GSM-EDGE (which employs both AM and PM), the power output of the portable transceiver must be more closely controlled. For example, instead of a relative power measurement as mentioned above, it may be desirable to output a specific power level. In such systems, a closed loop power control system is necessary to achieve the close output power tolerances. As mentioned above, in a closed loop power control system a portion of the signal output from the power amplifier is compared with a reference signal and the resulting error signal is fed back to the input of the power amplifier, thus providing a higher degree of accuracy in the output power level.

Furthermore, there is a need in the industry for a transmission technique that can be used to transmit a signal having both a PM component and an AM component, while retaining the benefits of using a non-linear, and therefore highly efficient, power amplifier and the ability to supply the PM modulated signal to the power amplifier directly from an oscillator, while employing a closed loop power control system. Also, there is a need in the industry for a transmission technique in which a closed loop power control system is applied to a linear power amplifier in which a signal having both a PM component and an AM component is amplified.

SUMMARY

The invention provides a system for power control using a closed power control feedback loop in applications using either a linear or a non-linear power amplifier. In one aspect, the invention may be conceptualized as a method for controlling output power from an amplifier using a closed power control feedback loop, comprising the steps of supplying a first modulated signal to a power amplifier, detecting a portion of an output of the power amplifier using a power detector in a closed power control feedback loop, adjusting the output power of the power amplifier based upon the detected portion of the output of the power amplifier and a reference signal, and injecting a second modulated signal into the feedback loop using a variable gain element.

Architecturally, the invention can be conceptualized as a system for controlling output power from an amplifier using a closed power control feedback loop, comprising a power amplifier configured to receive a first modulated signal, a power detector located in a closed power control feedback loop and configured to detect a portion of an output of the power amplifier, a comparator configured to develop an error signal used to adjust the output power of the power amplifier based upon the difference between the detected portion of the output of the power amplifier and a reference signal, and a variable gain amplifier configured to inject a second modulated signal into the feedback loop.

The invention allows the injection of an AM signal into the power control feedback loop of a non-linear power amplifier, and also allows closed loop feedback control of a linear power amplifier in which both a PM signal and an AM signal are amplified. By injecting an inverted version of the desired AM signal, the closed power control loop of the invention can control power in both a system in which only a PM component of a signal is supplied to the input of a non-linear amplifier and a system in which a modulated signal including both a PM component and an AM component are supplied to a linear amplifier.

Related methods of operation and computer readable media are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a GSM portable transceiver, the closed power control feedback loop of the invention may be implemented in any system where a PM signal is supplied to a non-linear power amplifier, and an AM signal is added to the PM signal in the power amplifier. The closed power control feedback loop is applicable to any system where it is desirable to implement a closed power control feedback loop and where a PM signal and an AM signal are supplied to a linear power amplifier.

The closed power control feedback loop of the invention can be implemented in software, hardware, or a combination of software and hardware. Selected portions of the closed power control feedback loop are implemented in hardware and software. The hardware portion of the invention can be implemented using specialized hardware logic. The software portion can be stored in a memory and be executed by a suitable instruction execution system (microprocessor). The hardware implementation of the closed power control feedback loop can include any or a combination of the following technologies that are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

The closed power control feedback loop software comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium may include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
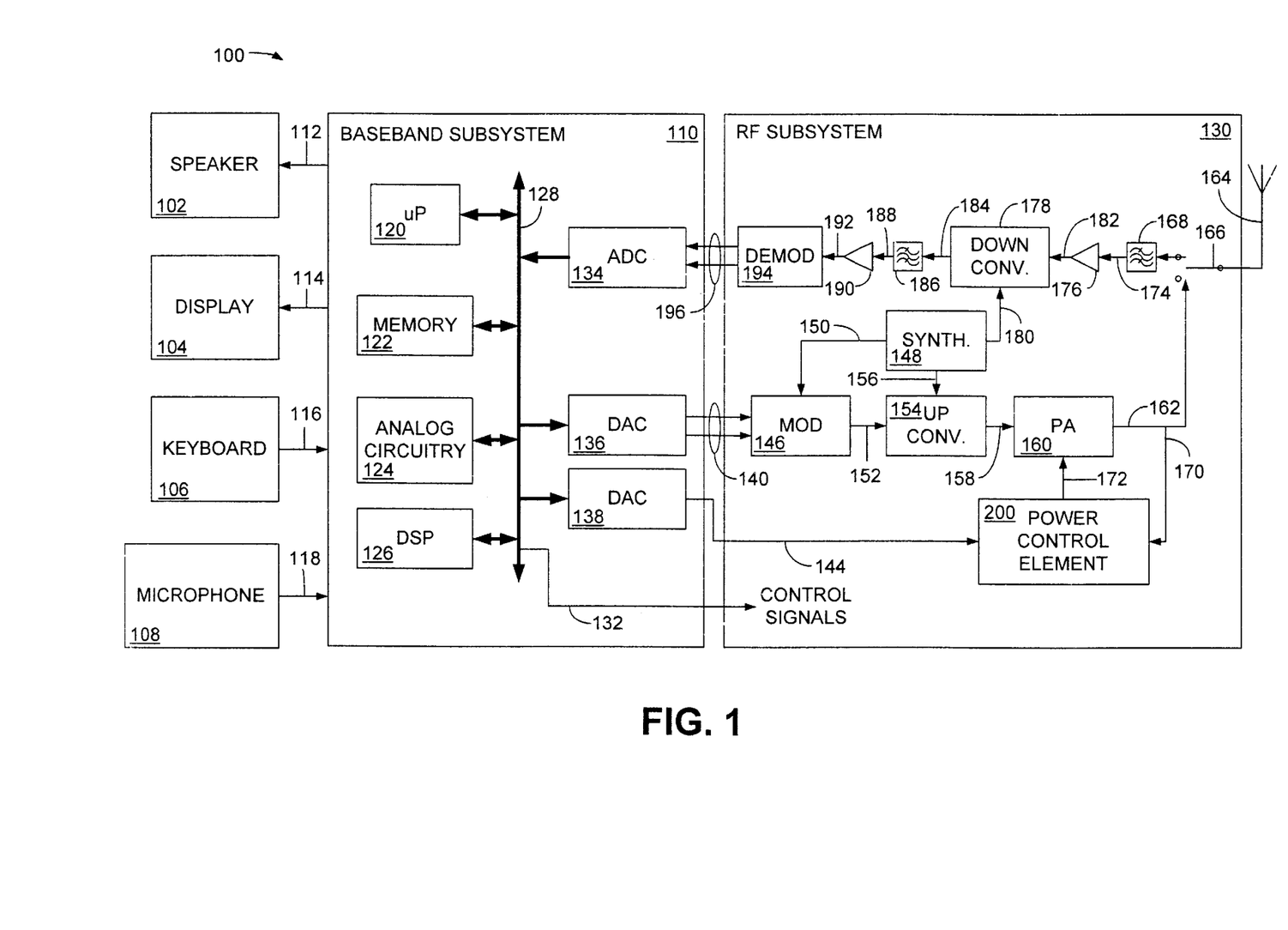
FIG. 1 is a block diagram illustrating a simplified portable transceiver.

Turning now to the figures, FIG. 1 is a block diagram illustrating a simplified portable transceiver 100. Portable transceiver 100 includes speaker 102, display 104, keyboard 106, and microphone 108, all connected to baseband subsystem 110. In a particular embodiment, portable transceiver 100 can be, for example but not limited to, a portable telecommunication handset such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor ($\mu$P) 120, memory 122, analog circuitry 124, and digital signal processor (DSP) 126 in communication via bus 128. Bus 128, though shown as a single bus, may be implemented using a number of busses connected as necessary among the subsystems within baseband subsystem 110. Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to radio frequency (RF) subsystem 130 via connection 132. Although shown as a single connection 132, the control signals may originate from DSP 126 or from microprocessor 120, and are supplied to a variety of points within RF subsystem 130. It should be noted that, for simplicity, only the basic components of portable transceiver 100 are illustrated.

Baseband subsystem 110 also includes analog-to-digital converter (ADC) 134 and digital-to-analog converters (DACs) 136 and 138. ADC 134, DAC 136 and DAC 138 also communicate with microprocessor 120, memory 122, analog circuitry 124 and DSP 126 via bus 128. DAC 136 converts the digital communication information within baseband subsystem 110 into an analog signal for transmission to RF subsystem 130 via connection 140. In accordance with an aspect of the invention, DAC 138 provides a reference voltage power level signal to power control element 200 via connection 144. Connection 140, while shown as two directed arrows, includes the information that is to be transmitted by RF subsystem 130 after conversion from the digital domain to the analog domain.

RF subsystem 130 includes modulator 143, which after receiving a frequency reference signal, also called a "local oscillator," signal, or "LO," from synthesizer 148 via connection 150, modulates the received analog information and provides a modulated signal via connection 152 to upconverter 154. Upconverter 154 also receives a frequency reference signal from synthesizer 148 via connection 156. Synthesizer 148 determines the appropriate frequency to which upconverter 154 will upconvert the modulated signal on connection 152.

Upconverter 154 supplies the fully modulated signal at the appropriate transmit frequency via connection 158 to power amplifier 160. Power amplifier 160 amplifies the modulated signal on connection 158 to the appropriate power level for transmission via connection 162 to antenna 164. Illustratively, switch 166 controls whether the amplified signal on connection 162 is transferred to antenna 164 or whether a received signal from antenna 164 is supplied to filter 168. The operation of switch 166 is controlled by a control signal from baseband subsystem 110 via connection 132.

A portion of the amplified transmit signal power on connection 162 is supplied via connection 170 to power control element 200. Power control element 200, may form a closed power control feedback loop and supply an information signal on connection 172 instructing the power amplifier 160 as to the correct power level to which the signal on connection 158 should be amplified. The operation of power control element 200 will be described in further detail with respect to FIGS. 2, 3 and 4.

A signal received by antenna 164 may, at the appropriate time, determined by baseband subsystem 110, be directed via switch 166 to receive filter 168. Receive filter 168 will filter the received signal and supply the filtered signal on connection 174 to low noise amplifier (LNA) 176. Receive filter 168 may be a bandpass filter that passes all channels of the particular cellular system where the portable transceiver 100 is operating. As an example, for a 900 MHz GSM system, receive filter 168 would pass all frequencies from 935.1 MHz to 959.9MHZ, covering all 124 contiguous channels of 200 kHz each. The purpose of this filter is to reject all frequencies outside the desired region. LNA 176 amplifies the very weak signal on connection 174 to a level at which downconverter 178 can translate the signal from the transmitted frequency back to a baseband frequency. Alternatively, the functionality of LNA 176 and downconverter 178 can be accomplished using other elements; such as for example but not limited to, a low noise block downconverter (LNB).

Downconverter 178 receives a frequency reference signal, also called a "local oscillator" signal, or "LO," from synthesizer 148, via connection 180. That signal instructs the downconverter 178 as to the proper frequency to which to downconvert the signal received from LNA 176 via connection 182. The downconverted frequency is called the intermediate frequency (IF). Downconverter 178 sends the downconverted signal via connection 184 to channel filter 186, also called the "IF filter." Channel filter 186 filters the downconverted signal and supplies it via connection 188 to amplifier 190. The channel filter 186 selects the one desired channel and rejects all others. Using the GSM system as an example, only one of the 124 contiguous channels is actually to be received. After all channels are passed by receive filter 168 and downconverted in frequency by downconverter 178, only the one desired channel will appear precisely at the center frequency of channel filter 186. The synthesizer 148, by controlling the local oscillator frequency supplied on connection 180 to downconverter 178, determines the selected channel. Amplifier 190 amplifies the received signal and supplies the amplified signal via connection 192 to demodulator 194. Demodulator 194 recovers the transmitted analog information and supplies a signal representing this information via connection 196 to ADC 134. ADC 134 converts these analog signals to a digital signal at baseband frequency and transfers it via bus 128 to DSP 126 for further processing.

Figure 2:
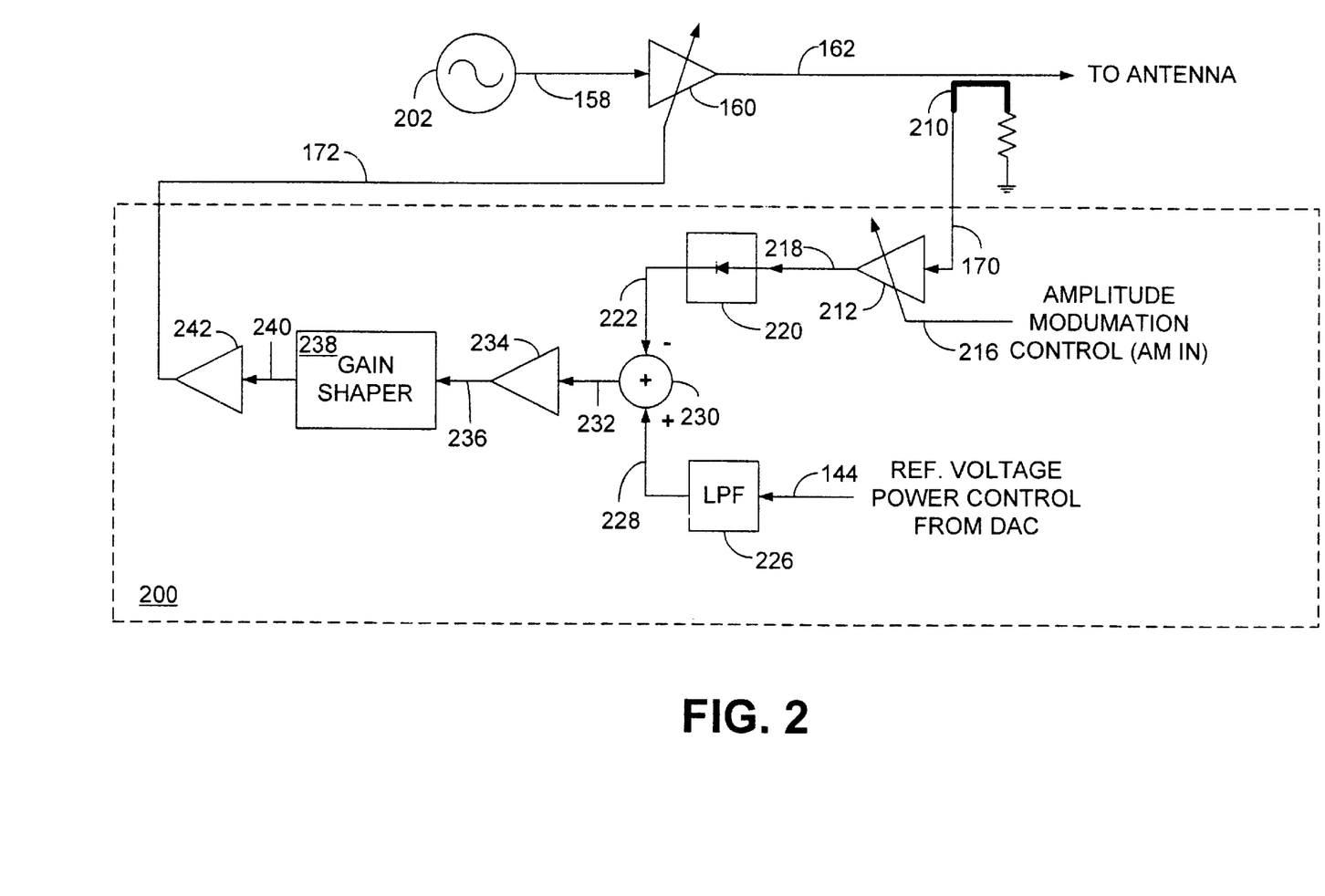
FIG. 2 is a block diagram illustrating, in further detail, the power control element of FIG. 1.

FIG. 2 is a block diagram illustrating the power control element 200 of FIG. 1. For simplicity, the function of the modulator 146 and the upconverter 154 of FIG. 1 are illustrated in FIG. 2 using oscillator 202. Oscillator 202, may be a voltage controlled oscillator (VCO) and supplies a very clean modulated signal (i.e, a signal with very low out-of-band noise) via connection 158 to power amplifier 160. By using an oscillator 202 to supply a low-noise modulated signal to power amplifier 160, the need for filtering before and after the power amp 160 may be reduced or eliminated. In accordance with an aspect of the invention, the signal supplied from oscillator 202 to power amp 160 contains only a phase modulated signal.

A portion of the output power present on connection 162 is diverted by coupler 210 to a variable gain element 212 via connection 170. Variable gain element 212 can be either an amplifier or an attenuator depending upon the amount of gain required for the particular circuit application. For example, whether variable gain element 212 is an amplifier or an attenuator is determined by the signal levels and power levels present in the balance of the system. Variable gain element 212 is used as the vehicle through which an amplitude modulated signal is introduced into the closed power control feedback loop of the invention, thereby allowing the portable transceiver 100 (FIG. 1) to transmit a signal that includes both a PM component and an AM component, while allowing only the PM component to be supplied to the input of power amplifier 160 on connection 158. The AM signal introduced via connection 216 to the control input of the variable gain element 212 is an inverse version of the AM signal desired at the output of power amplifier 160 on connection 162. In this manner, the power amplifier 160 can be a non-linear, and therefore, very efficient, amplifier. By employing this aspect of the invention, a portable transceiver 100 (FIG. 1) can retain the benefits of using a non-linear, highly efficient power amplifier while still having the ability to transmit a signal, which includes both a PM component and an AM component.

Returning now to the discussion of power control element 200 of FIG. 2, variable gain element 212, after introducing the AM component into the feedback loop, supplies RF energy via connection 218 to logarithmic (log) detector 220. Log detector 220 receives the RF signal on connection 218 and provides, on connection 222, a direct current (DC) baseband signal representing the level of the RF power signal present on connection 218. A reference voltage power control signal from the DAC 138 of FIG. 1 is supplied via connection 144 to low pass filter 226. Low pass filter 226 has the characteristic that allows the desired power level signal supplied on connection 144 to pass via connection 228 to comparator 230, while rejecting high frequency products that are due to the stairstep output function of DAC 138. Comparator 230 compares the signal level on connection 222 with the signal level on connection 228 and provides an error signal representing the difference on connection 232. The error signal on connection 232 represents the difference between the output power measured from the power amplifier 160 and the desired output level supplied on connection 144.

The error signal on connection 232 is supplied to loop filter 234 that in this aspect of the invention can be a passive filter, a band limited amplifier, or an integrator. Loop filter 234 supplies an amplified error signal on connection 236 to gain shaper 238. Gain shaper 238 provides a non-linear transfer function that is substantially the inverse characteristic of the non-linear control shape of the power amplifier 160. In this way, gain shaper 238 "linearizes" the control loop, because with it, the total loop gain becomes about the same at any operating point, i.e., at any power level. It should be noted that gain shaper 238 is not necessary if power amplifier 160 exhibits a linear control characteristic. The signal from gain shaper 238 is supplied via connection 240 to driver 242. Driver 242 provides an amplified drive level of the signal on connection 240 via connection 172 to power amp 160. In this manner, the output power of power amplifier 160 is controlled via power control element 200, while the AM component of the transmission signal is introduced to the power amplifier 160 via the feedback loop.

Essentially, the components within the power control element 200 form a closed power control feedback loop for power amplifier 160. In this manner, and with respect to this aspect of the invention, a portable transceiver 100 (FIG. 1) employing the closed power control feedback loop of the invention, can supply a transmit signal containing both a PM component and an AM component while retaining the use of a highly efficient, non-linear power amplifier 160 and also benefit from a closed loop power control feedback control system. The closed power control feedback loop of the invention, by introducing an inverse version of the desired AM component through the variable gain element 212 will, by its nature, keep the feedback signal constant, thereby effectively amplitude modulating the output of power amp 160 inversely to the gain variation of the variable gain element 212. By controlling the variable gain element with a signal that is the inverse of the desired amplitude modulation, the output signal is thus amplitude modulated in the desired way. In this manner, the commonly used GSM translation loop architecture can be maintained, while providing the ability to transmit a signal containing both a PM component and an AM component.

In an application where a modulated signal containing both a PM component and an AM component are supplied to a power amplifier, the power amplifier is preferably linear in order to reduce the occurrence of AM to PM conversion. AM to PM conversion occurs due to the inherent amplitude dependence of an amplifier's phase shift characteristic that is most severe in the case of highly efficient amplifiers. In such amplifiers, the signal's AM causes the phase to be modulated as the amplifier's phase shift characteristic varies with the signal amplitude, resulting in a distorted transmit signal. Unfortunately, linear amplifiers that have low AM to PM conversion, are highly inefficient.

In such an application, the closed power control feedback loop of the invention, and specifically the variable gain element 212, can be used to provide closed loop power control feedback. In such an application, by injecting an inverse of the desired AM component of the transmitted signal through variable gain element 212, the desired signal including AM and PM will be available on connection 162. In a typical closed power control feedback loop employed in a system in which both a PM component and an AM component are supplied to the input of a power amplifier, a closed power control feedback loop will tend to cancel any AM component present in the output of power amplifier 160. In accordance with this aspect of the invention, by injecting the inverse of the desired AM component into variable gain element 212 via connection 216, the AM component will be invisible in the feedback loop, and the feedback loop will therefore act only upon the average power of the signal, thereby allowing the closed power control feedback loop of the invention to provide closed loop power control in a system in which both a PM component and an AM component are supplied as input to a power amplifier.

Figure 3:
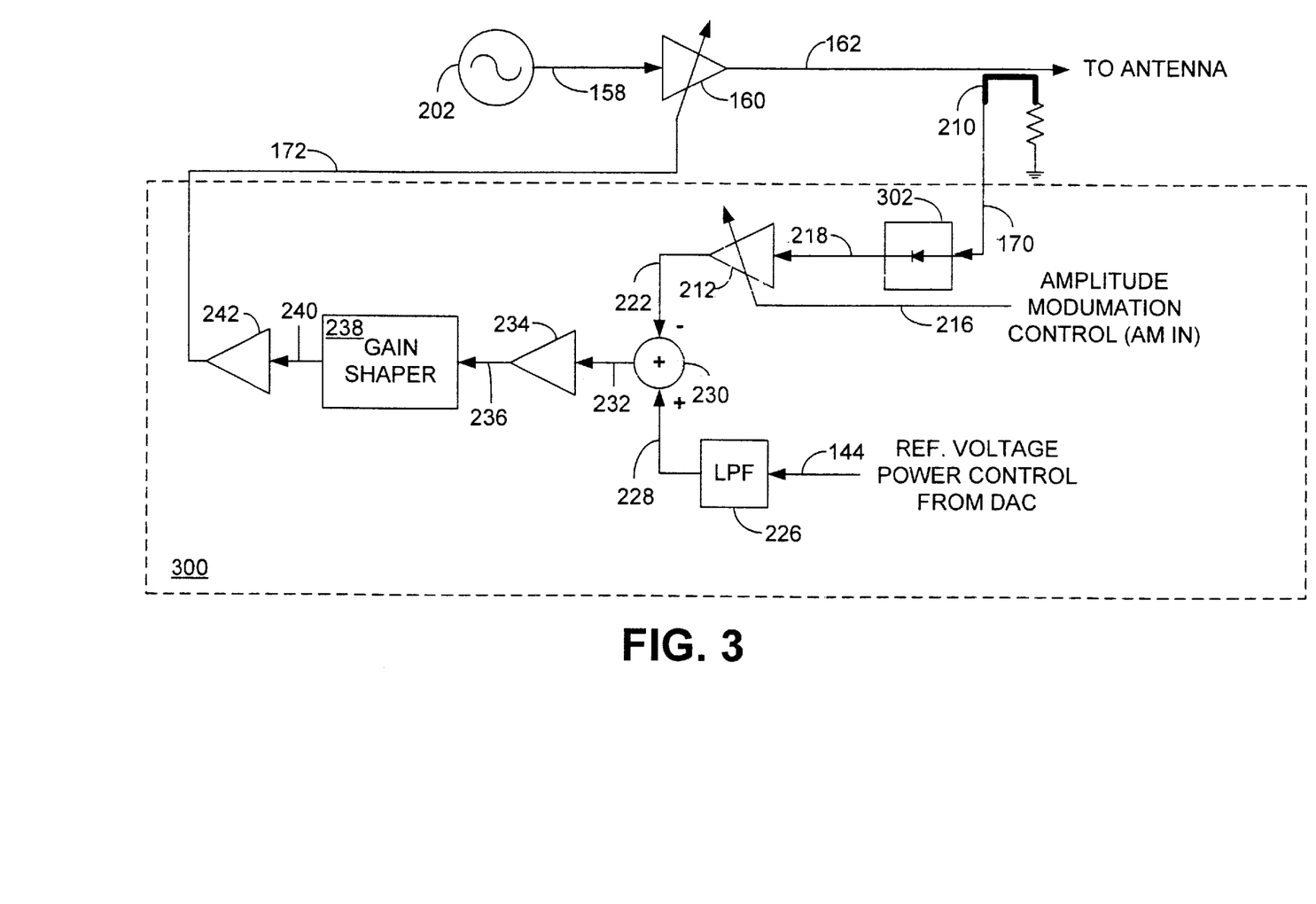
FIG. 3 is a block diagram illustrating another aspect of the power control element of FIG. 2.

FIG. 3 is a block diagram illustrating another aspect 300 of the power control element of FIG. 2. As shown in FIG. 3, the variable gain element 212 is located so as to receive the output of log detector 302. In this aspect of the invention, log detector 302 supplies a DC baseband signal representing the level of the RF power signal available on connection 170 to the variable gain element 212 via connection 218. The variable gain element 212 operates as described above with respect to FIG. 2 and provides a DC baseband signal representing a level of the RF power signal including an inverse of the desired AM component via connection 222 to comparator 230. The balance of the circuit shown in FIG. 3 operates as described above with respect to FIG. 2.

Figure 4:
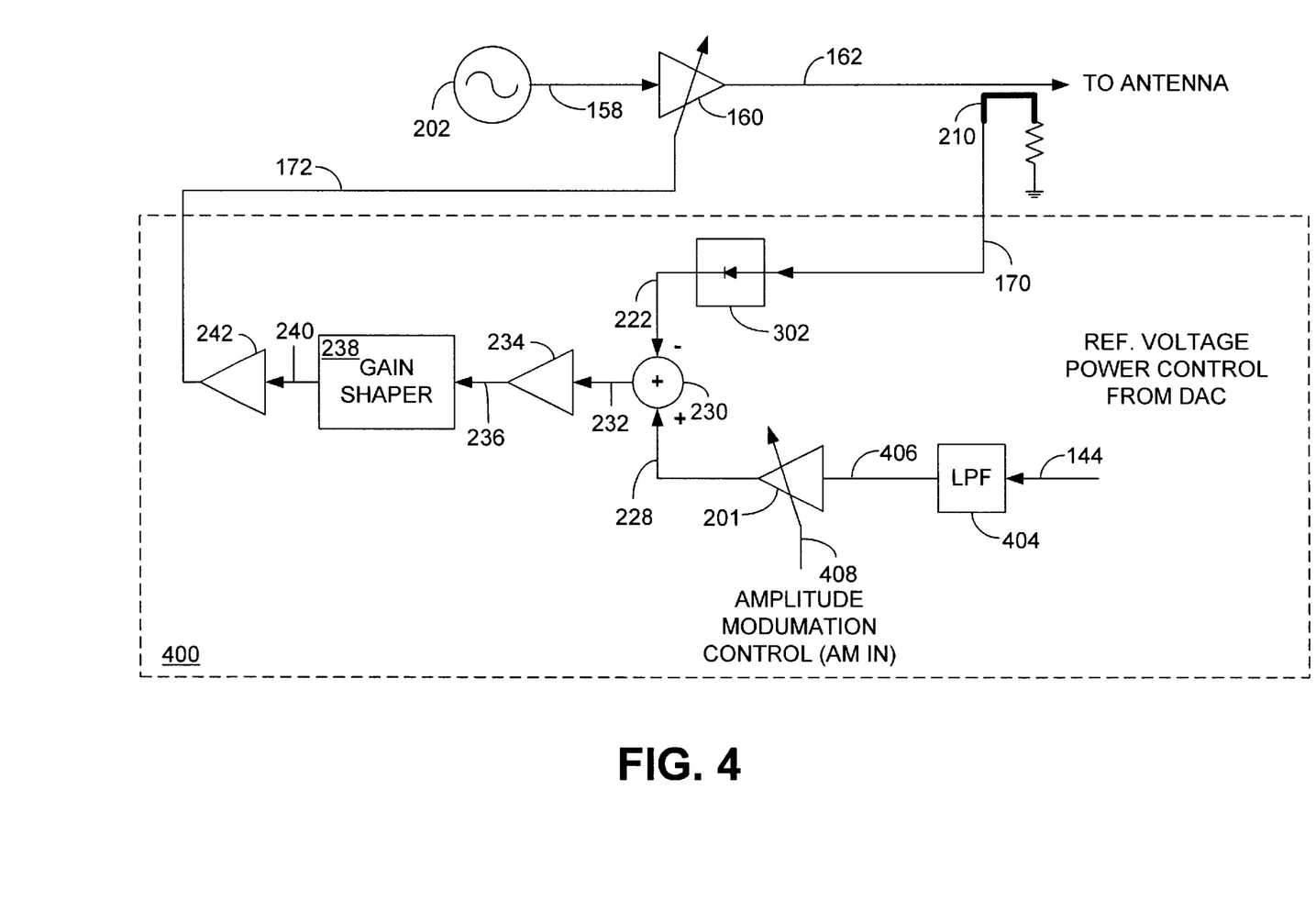
FIG. 4 is a block diagram illustrating another aspect of the power control element of FIG. 2.

FIG. 4 is a block diagram illustrating another aspect 400 of the power control element 200 of FIG. 2. As shown in FIG. 4, the variable gain element 201 receives the output of low pass filter 404 via connection 406 and supplies a signal including the reference voltage from the DAC 138 (FIG. 1) along with the desired AM component of the signal via connection 228 to comparator 230. In a departure from that described above with respect to FIGS. 2 and 3, the arrangement illustrated in FIG. 4 injects the desired AM signal (not an inverse of the desired AM signal as shown above) to the control input of variable gain element 201 via connection 408. Because the AM signal is applied to the reference signal, which is supplied by the DAC 138, and because the output of the loop follows the reference signal, the AM signal applied via connection 408 is not inverted. Log detector 302 supplies a DC baseband signal representing the level of the RF power signal present on connection 170 to comparator 230 via connection 222. The balance of the circuit shown in FIG. 4 operates as described above with respect to FIG. 2. A comparison of FIG. 4 to FIG. 3 shows that the intent is for the comparator output to respond only to the average power of the signal and not the AM. As shown in FIG. 4, the injected AM signal on connection 408 is the actual desired AM and not the inverse. In this manner, both signals compared by comparator 230 contain the same AM component, and these are cancelled in the comparator output, causing the remainder of the loop to respond only to the difference signal that is proportional to the average power and not the AM. In the case of the embodiment of FIG. 3, neither of the signals entering comparator 230 have any AM because the input from connection 222 has had the AM stripped off by the injection of the inverse AM signal at variable gain element 201.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for controlling output power from an amplifier using a closed power control feedback loop, comprising the steps of:
   supplying a first modulated signal to a power amplifier;
   detecting a portion of an output of the power amplifier using a power detector in a closed power control feedback loop;
   adjusting the output power of the power amplifier based upon the detected portion of the output of the power amplifier and a reference signal; and
   injecting a second modulated signal into the feedback loop using a variable gain element, wherein the second modulated signal is an inverse of a desired second modulated signal.

2. The method of claim 1, wherein the variable gain element is an amplifier.

3. The method of claim 1, wherein the variable gain element is an attenuator.

4. The method of claim 1, wherein the first modulated signal is a phase modulated signal.

5. The method of claim 1, wherein the second modulated signal is an amplitude modulated signal.

6. The method of claim 1, wherein the variable gain element operates on a radio frequency (RF) signal.

7. The method of claim 1, wherein the variable gain element operates on a baseband signal representing the radio frequency (RF) power level of the output power of the power amplifier.

8. A method for controlling output power from an amplifier using a closed power control feedback loop, comprising the steps of:
   supplying a combined modulated signal to a power amplifier, the combined modulated signal including a first portion and a second portion;
   detecting a portion of an output of the power amplifier using a power detector in a closed power control feedback loop;
   adjusting the output power of the power amplifier based upon the difference between the detected portion of the output of the power amplifier and a reference signal; and
   injecting a second modulated signal into the feedback loop using a variable gain element, the second modulated signal being an inverse of the second portion of the combined modulated signal.

9. The method of claim 8, wherein the variable gain element is an amplifier.

10. The method of claim 8, wherein the variable gain element is an attenuator.

11. The method of claim 8, wherein the first portion of the combined modulated signal is phase modulated.

12. The method of claim 8, wherein the second portion of the combined modulated signal is amplitude modulated.

13. The method of claim 8, wherein the variable gain element operates on a radio frequency (RF) signal.

14. The method of claim 8, wherein the variable gain element operates on a baseband signal representing the radio frequency (RF) power level of the output power of the power amplifier.

15. A system for controlling output power from an amplifier using a closed power control feedback loop, comprising:
   a power amplifier configured to receive a first modulated signal;
   a power detector located in a closed power control feedback loop and configured to detect a portion of an output of the power amplifier;
   a comparator configured to develop an error signal used to adjust the output power of the power amplifier based upon the difference between the detected portion of the output of the power amplifier and a reference signal; and
   a variable gain amplifier configured to inject a second modulated signal into the feedback loop, wherein the second modulated signal is an inverse of a desired second modulated signal.

16. The system of claim 15, wherein the variable gain element is an amplifier.

17. The system of claim 15, wherein the variable gain element is an attenuator.

18. The system of claim 15, wherein the first modulated signal is a phase modulated signal.

19. The system of claim 15, wherein the second modulated signal is an amplitude modulated signal.

20. The system of claim 15, wherein the variable gain element operates on a radio frequency (RF) signal.

21. The system of claim 15, wherein the variable gain element operates on a baseband signal representing the radio frequency (RF) power level of the output power of the power amplifier.

22. A system for controlling output power from an amplifier using a closed power control feedback loop, comprising:
   a power amplifier configured to receive a combined modulated signal, the combined modulated signal including a first portion and a second portion;
   a power detector located in a closed power control feedback loop and configured to detect a portion of an output of the power amplifier;
   a comparator configured to develop an error signal used to adjust the output power of the power amplifier based upon the difference between the detected portion of the output of the power amplifier and a reference signal; and
   a variable gain element configured to inject a second modulated signal into the feedback loop, the second modulated signal being an inverse of the second portion of the combined modulated signal.

23. The system of claim 22, wherein the variable gain element is an amplifier.

24. The system of claim 22, wherein the variable gain element is an attenuator.

25. The system of claim 22, wherein the first portion of the combined modulated signal is phase modulated.

26. The system of claim 22, wherein the second portion of the combined modulated signal is amplitude modulated.

27. The system of claim 22, wherein the variable gain element operates on a radio frequency (RF) signal.

28. The system of claim 22, wherein the variable gain element operates on a baseband signal representing the radio frequency (RF) power level of the output power of the power amplifier.

29. A computer readable medium having a program for controlling output power from an amplifier using a closed power control feedback loop, the program comprising logic configured to perform the steps of:

supplying a first modulated signal to a power amplifier;

detecting a portion of an output of the power amplifier using a power detector in a closed power control feedback loop;

adjusting the output power of the power amplifier based upon the detected portion of the output of the power amplifier and a reference signal; and injecting a second modulated signal into the feedback loop using a variable gain element, wherein the second modulated signal is an inverse of a desired second modulated signal.

30. The program of claim 29, wherein the variable gain element is an amplifier.

31. The program of claim 29, wherein the variable gain element is an attenuator.

32. The program of claim 29, wherein the first modulated signal is a phase modulated signal.

33. The program of claim 29, wherein the second modulated signal is an amplitude modulated signal.

34. The program of claim 29, wherein the variable gain element operates on a radio frequency (RF) signal.

35. The program of claim 29, wherein the variable gain element operates on a baseband signal representing the radio frequency (RF) power level of the output power of the power amplifier.

36. A computer readable medium having a program for controlling output power from an amplifier using a closed power control feedback loop, the program comprising logic configured to perform the steps of:

supplying a combined modulated signal to a power amplifier, the combined modulated signal including a first portion and a second portion;

detecting a portion of an output of the power amplifier using a power detector in a closed power control feedback loop;

adjusting the output power of the power amplifier based upon the difference between the detected portion of the output of the power amplifier and a reference signal; and injecting a second modulated signal into the feedback loop using a variable gain element, the second modulated signal being an inverse of the second portion of the combined modulated signal.

37. The program of claim 36, wherein the variable gain element is an amplifier.

38. The program of claim 36, wherein the variable gain element is an attenuator.

39. The program of claim 36, wherein the first portion of the combined modulated signal is phase modulated.

40. The program of claim 36, wherein the second portion of the combined modulated signal is amplitude modulated.

41. The program of claim 36, wherein the variable gain element operates on a radio frequency (RF) signal.

42. The program of claim 36, wherein the variable gain element operates on a baseband signal representing the radio frequency (R-F) power level of the output power of the power amplifier.

43. A system for controlling output power from an amplifier using a closed power control feedback loop, comprising:

means for supplying a first modulated signal to a power amplifier;

means for detecting a portion of an output of the power amplifier using a power detector in a closed power control feedback loop;

means for adjusting the output power of the power amplifier based upon the detected portion of the output of the power amplifier and a reference signal; and means for injecting a second modulated signal into the feedback loop using a variable gain element, wherein the second modulated signal is an inverse of a desired second modulated signal.

44. A system for controlling output power from an amplifier using a closed power control feedback loop, comprising:

means for receiving a first modulated signal in a power amplifier;

means for detecting a portion of an output of the power amplifier, means for developing an error signal used to adjust the output power of the power amplifier based upon the difference between the detected portion of the output of the power amplifier and a reference signal; and means for injecting a second modulated signal into the feedback loop wherein the second modulated signal is an inverse of a desired second modulated signal.

\* \* \* \* \*